United States Patent
Nikawa

(10) Patent No.: US 7,495,449 B2
(45) Date of Patent: Feb. 24, 2009

(54) NON-DESTRUCTIVE TESTING APPARATUS AND NON-DESTRUCTIVE TESTING METHOD

(75) Inventor: Kiyoshi Nikawa, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/589,949

(22) Filed: Oct. 31, 2006

(65) Prior Publication Data

US 2007/0115003 A1 May 24, 2007

(30) Foreign Application Priority Data

Nov. 2, 2005 (JP) ............................... 2005-319858

(51) Int. Cl.
G01R 31/00 (2006.01)
G01R 33/02 (2006.01)

(52) U.S. Cl. ........................................ 324/501; 324/248

(58) Field of Classification Search ................. 324/501, 324/500, 718, 456, 216, 237, 238, 240, 765, 324/523, 527, 752
See application file for complete search history.

(56) References Cited

U.S. PATENT DOCUMENTS

| 5,045,788 | A | * | 9/1991 | Hayashi et al. | ............. | 324/248 |
| 6,151,118 | A | * | 11/2000 | Norita et al. | ................ | 356/602 |
| 7,019,311 | B1 | * | 3/2006 | Horn | ....................... | 250/484.4 |
| 7,026,830 | B2 | * | 4/2006 | Shinada et al. | ............. | 324/751 |
| 2007/0189436 | A1 | * | 8/2007 | Goto et al. | ..................... | 378/4 |

* cited by examiner

Primary Examiner—Vincent Q Nguyen
Assistant Examiner—Hoai-An D Nguyen
(74) Attorney, Agent, or Firm—Young & Thompson

(57) ABSTRACT

A non-destructive testing method of improved efficiency. Two one-dimensional images are obtained by scanning an optical line over an object to be tested in an X- and Y-directions each for one scan in lieu of conducting a prior art method of two-dimensionally scanning a optical spot on the object to be tested. A two-dimensional image is reconstructed from the obtained two one-dimensional images. Since only two relative scans between the object to be tested and the optical line is necessary, scanning time is remarkably shortened in comparison with that of the prior art.

14 Claims, 14 Drawing Sheets

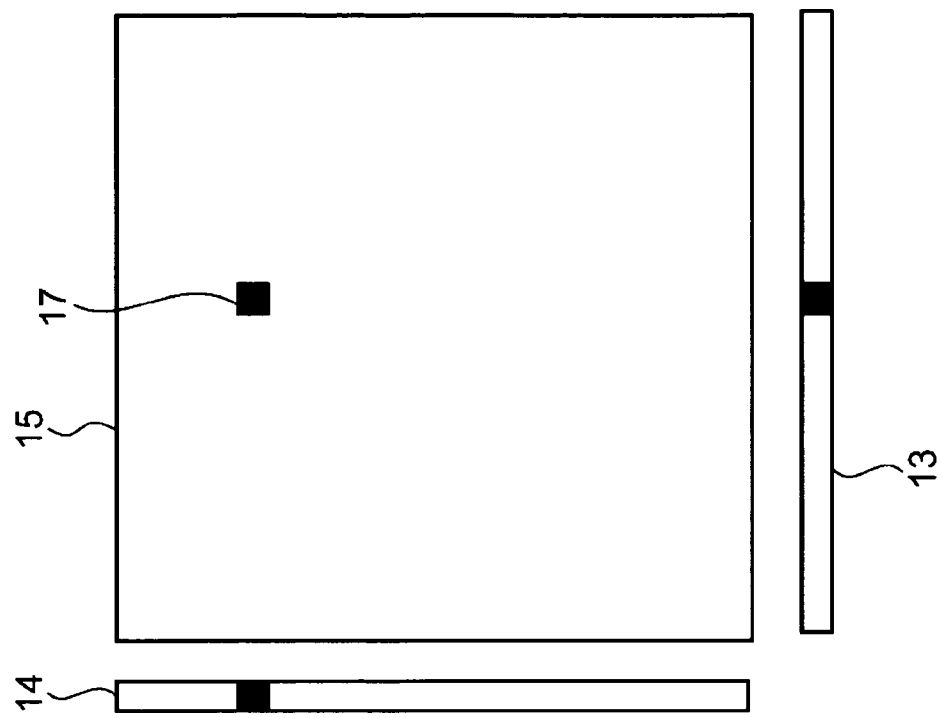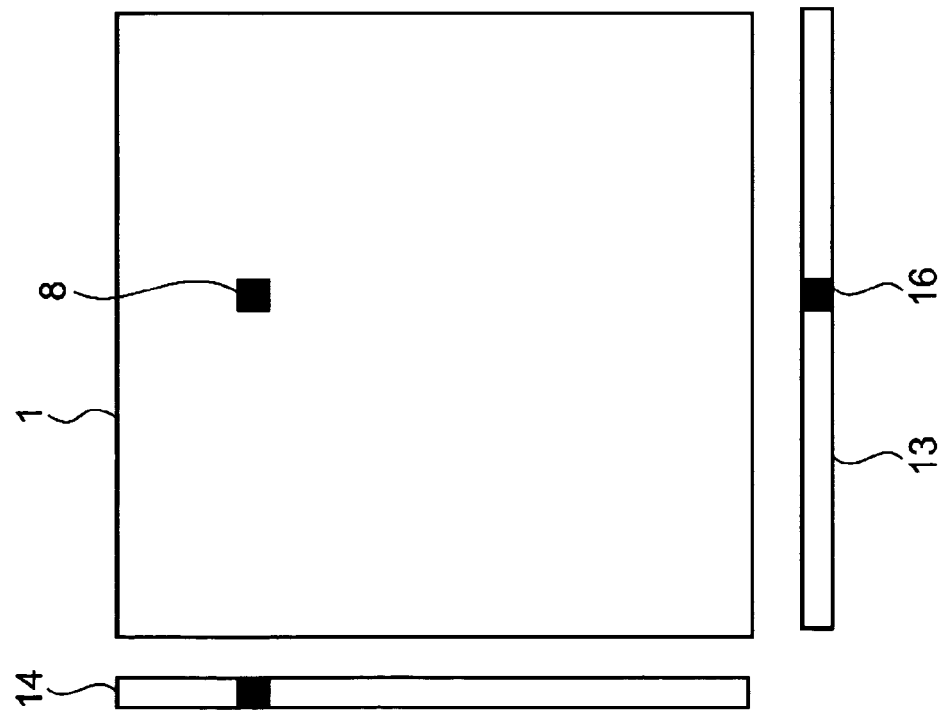

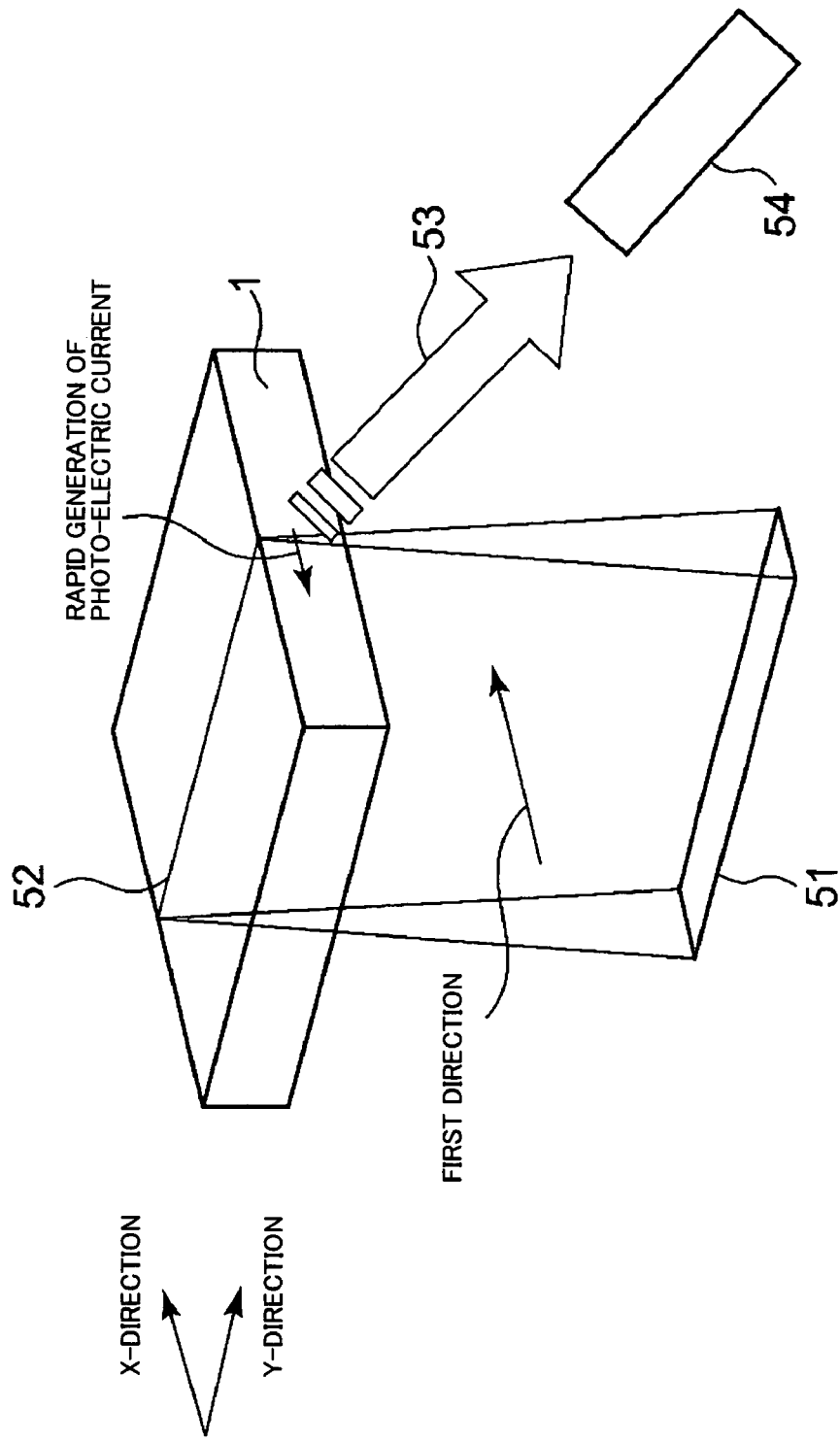

NON-DESTRUCTIVE TESTING APPARATUS AND NON-DESTRUCTIVE TESTING METHOD

FIELD OF THE INVENTION

The present invention relates to a non-destructive testing apparatus and a non-destructive testing method, and in particular to a non-destructive testing apparatus and a non-destructive testing method which is suitable to examine a defect(s) of semiconductor devices.

BACKGROUND OF THE INVENTION

OBIRCH (Optical Beam Induced Resistance Change) method has been known as a prior art non-destructive testing method for electronic components (objects to be tested) such as semiconductor chips. In the OBIRCH method, wirings are heated when laser light is scanned over a semiconductor chip and changes in wiring resistance which is caused by heating with irradiation of laser light, are imaged. In accordance with this method, the wirings through which currents flow can be visualized. Since the level of temperature elevation is different between a position where there is a defect such as void and a position where there is no defect, the defect can be identified on the image (refer to non-Paten Reference 1). FIG. 13 is a basic principle view showing a related art non-destructive testing apparatus using the OBIRCH method. Wiring 4 is formed on a semiconductor chip which is an object 1 to be tested. The wiring 5 is connected at one end thereof with a voltage supply source 5 and is connected at the other end thereof with a current change detecting unit 6, so that a change in resistance of the wiring 4 is detected. In the OBIRCH method, an optical spot 3 which is formed by condensing a laser beam 2 to be scanned on and along the object 1 to be tested, so that a change in resistance of the wiring when it is heated is imaged. In accordance with the OBIRCH method, the wiring through which current flows can be visualized and the temperature elevation is different between a position where there is a defect such as void in the wiring and a position where there is no defect. Therefore, the defect can be identified on the image. FIG. 14 shows a two-dimensional image which is obtained by the foregoing method. An image of wiring 4 and an image of a defect 8 are visualized at an observation area 7.

RIL (Resistive Interconnection Localization) method or SDL (Soft Defect Localization) method which is a denomination more common than the RIL method has been known as prior art non-destructive testing method for electronic components such as semiconductor chips. If this method is used, a dynamic defect or fault analysis of defective component which is marginal with respect to temperature, power source voltage and operation frequency can be conducted. Semiconductor chips are sequentially heated by slowly scanning laser light on the chips to conduct testing of functions with a LSI tester for pass/fail testing. Dynamic determination of abnormal position is made possible by displaying a result of pass/fail testing in the LSI tester in monochrome on a pixel-by-pixel basis relative to the position where irradiation with laser light is conducted (refer to non-patent reference 1).

OBIC (Optical Beam Induced Current) method has also been known as prior art non-destructive method for electronic component (object to be tested) such as LSI chip. The OBIC method exploits a phenomenon in which pairs of electrons and holes which are excited by light are separated and are observed as currents. A source of an internal electrostatic field for separating pairs of electrons and holes may include a p-n junction and an impurity concentration gradient. An electrostatic field which is induced by an external application of a voltage may be used. Since a way of applications of internal and external electrostatic fields is different in the presence of short circuit and broken wire, fault position can be identified (refer to non-patent reference 1).

Furthermore, SCOBIC (Single Contact OBIC) method and scanned laser SQUID (Superconducting Quantum Interference Devices) microscope (L-SQ) method have been known as a failure analyzing technique which belongs to the OBIC system. In the OBIC method, an observation between two terminals is conducted, which restricts an OBIC generation path. If connection to only one terminal and observation is conducted, restriction of the OBIC generation path is mitigated, so that more positions can be observed. This method is referred to as "SCOBIC".

A method in which observation of current is not conducted from an external terminal, but a magnetic field which is generated by an OBIC current is observed by means of SQUID which is a magnetic field detector having a ultra-high sensitivity has been proposed. This method is referred to as "L-SQ" method. This method enables completely non-contact analysis which does not require even electrical connection. A sample which can be observed may include various forms such as wafers in the course of previous to step, in the course of wiring step, after completion of wafer step, after packaging and after mounting (refer to Non-Patent Document 1).

LTEM (Laser Terahertz Emission Microscope) method has been known as a prior art non-destructive testing method for electronic components (objects to be tested) such as semiconductor chips. In the LTEM method, Terahertz electromagnetic waves are detected which are radiated by transient optical current generated when a portion in which an electrostatic field exists such as p-n junction is irradiated with femto second laser. Data which suggest the possibility of observation of the operation of high speed device by the LTEM method is reported. It also reports the possibility of non-bias LTEM method which is a non-contact analysis which does not require even electrical connection as is similar to L-SQ method (refer to non-patent reference 1).

[Non-Patent Document 1]

Kiyoshi NIKAWA, "Optical Tools and Techniques for Failure Analysis of LSIs", Journal of JAPAN society of Reliability "Reliability" (REAJ), Vol. 26, No. 1, pp 28 to 36 (2004).

SUMMARY OF THE DISCLOSURE

When an observation is carried out by a non-destructive testing apparatus and the like using prior art OBIRCH method, etc., the object to be tested 1 is irradiated with an optical spot 3 which is formed by condensing laser light into a spot. With reference to the OBIRCH method as an example, a voltage is applied across two terminals of a semiconductor chip in a prior art non-destructive testing apparatus as shown in, for example, FIG. 13. An image corresponding to scanning position in which changes in current on irradiation with the optical spot is represented as changes in brightness is obtained. In order to obtain a two-dimensional image by such scanning, for example, to display the image with 1000 by 1000 pixels, a period of time which is million times as long as the time for the optical spot 3 to stay at each pixel or pass each pixel or more (because of loss time) will be taken.

It is a main object of the present invention to remarkably shorten time taken to conduct such scanning or to remarkably improve the efficiency of the non-destructive testing.

According to a first aspect of the present application, there is provided a non-destructive testing method which comprises: irradiating an object to be tested with a line-formed light (termed "optical line" or "optical line beam"); relatively scanning (i.e., sweeping) the optical line over the object to be tested in a first direction intersecting the optical line to obtain a first one-dimensional image; and relatively scanning the optical line over the object to be tested in a second direction intersecting the first direction to obtain a second one-dimensional image. A two-dimensional image is obtained from the first and second one-dimensional images by an operation.

The term "relatively scan" means that the scanning is performed by the relative movement between the irradiating light beam and the sample to be tested.

The first direction is preferably perpendicular to the longitudinal direction of the optical line.

A two-dimensional image is obtained from the first and second one-dimensional images through an operation.

An abnormal location of the object to be tested is localized for identification from the two-dimensional image.

The first and second one-dimensional images may be obtained by any one or any combination selected from the group consisting of Optical Beam Induced Resistance CHange OBIRCH method, Resistive Interconnection Localization RIL method, Soft Defect Localization SDL method, Optical Beam Induced Current OBIC method, Single Contact OBIC SCOBIC method, Scanning laser (Superconducting Quantum Interference Devices SQUID) method, microscopic L-SQ method, Laser Terahertz Emission Microscope LTEM method and non-bias LTEM method According to a second aspect of the present invention, there is provided a non-destructive testing apparatus which comprises a light source irradiating an object to be tested with a line-formed light (beam); a moving unit that relatively moves (i.e., sweeps) the optical line over the object to be tested; a one-dimensional image forming unit that forms a one-dimensional image from an observation result of a phenomenon which is caused by irradiation of the object to be tested with the optical line (beam); and a two-dimensional image forming unit for forming a two-dimensional information or image from a plurality of the one-dimensional images.

An observation system which observes a phenomenon caused by irradiation with the optical line may use at least one selected from the group consisting of Optical Beam Induced Resistance CHange OBIRCH method, Resistive Interconnection Localization RIL method, Soft Defect Localization SDL method, Optical Beam Induced Current OBIC method, Single Contact OBIC SCOBIC method, Scanning laser (Superconducting Quantum Interference Devices SQUID) method, microscopic L-SQ method, Laser Terahertz Emission Microscope LTEM method and non-bias LTEM method.

The moving unit may comprise an optical line scanning (or sweeping) unit that moves the optical line (beam).

The moving unit may comprise a stage that moves the object to be tested.

Positions of the optical line and a detector of the observation system may be fixed and; at least one of L-SQ, LTEM and non-bias LTEM may be used.

The detector of the observation system comprises a plurality of SQUID elements which are arrayed in the form of line, provided that the optical line and the plurality of SQUID elements arrayed in the form of line are fixed so that they are vertically overlapped each other along the longitudinal direction of the optical line.

The two-dimensional image forming unit may comprise a display unit for displaying the formed two-dimensional image and a plurality of the one-dimensional images from which the two-dimensional image is obtained.

The display unit may display a layout of the object to be tested and the two-dimensional image so that the former image is superimposed on the latter image The meritorious effects of the present invention are summarized as follows.

Since only two scans of the optical line relative to the object to be tested are necessary to obtain first and second one-dimensional images in accordance with the present invention, scanning time is significantly shortened. Since the time to obtain a two-dimensional image by an operation is much shorter than the scanning time of the optical line, this results in that time to acquire the two-dimensional image is shortened in comparison with time in prior art.

BRIEF DESCRIPTION OF THE DRAWINGS

FIGS. 2A and 2B are views for comparison between one-dimensional and two-dimensional images which are obtained by using the optical line scanning method of the present invention and the top plane view of the object to be tested.

FIG. 12 is a basic principle view explaining an embodiment 3 in which the optical line scanning method of the present invention is applied to non-bias LTEM method.

PREFERRED EMBODIMENTS OF THE INVENTION

The foregoing optical line scanning method of the present invention will be described in more detail. When the optical line (beam) is scanned (swept) relative to the object to be tested, information on changes in resistance which are generated on the whole of a line formed area irradiated with the optical line is obtained as one-dimensional information. A first one-dimensional image (X-scanned image) is obtained by scanning (sweeping) once the optical line (beam) in a first direction (X-direction) and a second one-dimensional image (Y-scanned image) is obtained by scanning (sweeping) the optical line (beam) in a second direction (Y-direction). It is most effective that the scanning direction of the optical line be perpendicular to the longitudinal direction of the optical line. If each of the first one-dimensional image (X-scanned image) and the second one-dimensional image (Y-scanned image) is displayed by, for example, 1000 pixels, the scanning time of the optical line is about 2000 times (1000 by 2) of the time for the optical line to stay at a pixel array or to pass therethrough (plus a loss time which is substantially equal to that of the prior art). A two-dimensional image is obtained by applying an operation to the first one-dimensional image (X-scanned image) and the second one-dimensional image (Y-scanned image). The operation method may be any method. In order to obtain a value $a(x, y)$ of each pixel of the two-dimensional image from a value $(x1, x2, \ldots, x1000)$ of each pixel of the first one-dimensional image (x-scanned image) and a value $(y1, y2, \ldots, y1000)$ of each pixel of the second one-dimensional image, it suffices to conduct a sum operation such as $a(1, 1)=x1+y1, a(1, 2)=x1+y2, \ldots, a(1000,1000)=x1000+y1000$ or a production operation such as $a(1, 1)=x1$ by $y1, a(1, 2)=x1$ by $y2, \ldots, a(1000, 1000)=x1000$ by $y1000$. Comparison between passed and faulty objects to be tested shows that there may be a defect at a position where a difference exists or its related position. If there is only one abnormal position at an observation area, it is easy to identify the abnormal position. If there are a plurality of abnormal positions at an observation area or the sensitivity of a detector used for the observation is non-uniform, certain devising is necessary. Wiring layout and design layout are useful for identifying abnormal position if any in such a case.

EMBODIMENTS

Figure 1A:
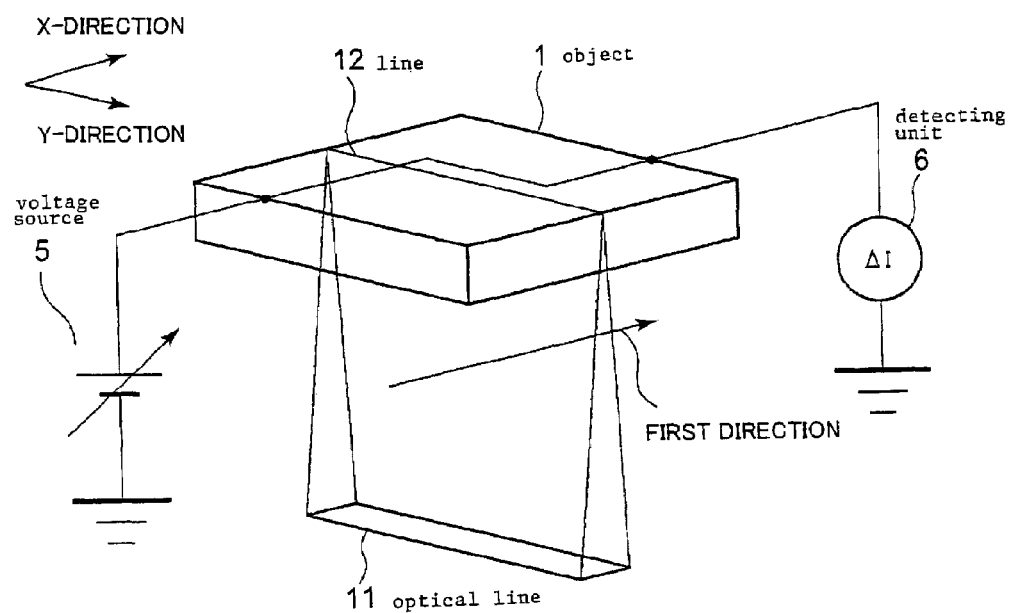
FIGS. 1A and 1B are basic principle views, respectively, explaining an embodiment 1 in which the optical line scanning method of the present invention is applied.
Figure 1B:
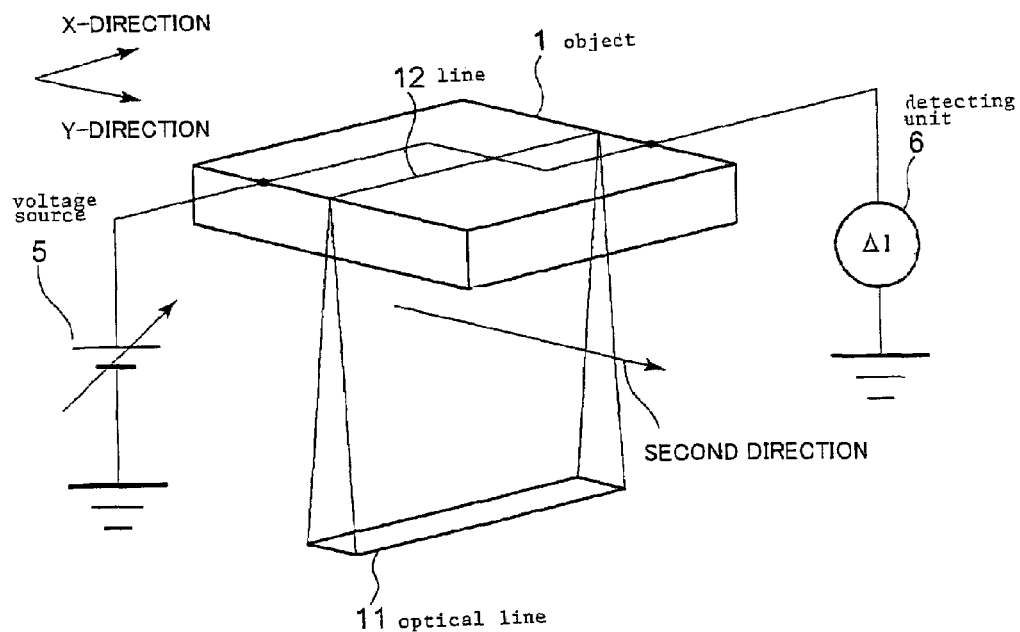

Embodiment of a non-destructive test apparatus and method using an optical line scanning method of the present invention will be described with reference to the drawings. FIGS. 1A and 1B are basic principle views, respectively, explaining an embodiment 1 in which the optical line scanning method of the present invention is applied to the OBIRCH (Optical Beam Induced Resistance Change) method. FIG. 2A is a view for comparison between a plane of an object to be tested on which a defect 8 exists and a first and second one-dimensional images 13, 14 which are obtained by using the optical line scanning method of the present invention. FIG. 2B is a view for comparison between thus obtained first and second one-dimensional images 13, 14 and a two-dimensional view 15 which is obtained from the images 13, 14.

In the OBIRCH method of the embodiment 1 to which the optical line scanning method of the present invention is applied, a voltage supply source 5 and a current change detecting unit 6 are connected between two terminals of an electronic component (object 1 to be tested) such as LSI chip and the like. The object to be tested is irradiated on the reverse side thereof with a laser light which is in the form of line having certain length sufficient to cover at least a portion of the object to be tested while a constant voltage is applied to the object 1. An optical line 12 preferably, extending over the entire width (or length) of the object is relatively scanned over the object to be tested 1 in a first direction (X-direction). It is efficient that the scanning line be in a direction perpendicular to the longitudinal direction of the optical line 12. A change in current which is caused due to the fact that the object to be tested is heated up by the scanning of the optical line 12 is detected by the current change detecting unit 6 (FIG. 1A). Subsequently, a change in current is also detected by scanning the optical line 12 in a second direction (Y-direction) similarly to the former scanning (FIG. 1B). Two one-dimensional images, a first one-dimensional image (X scan image) 13 and second one-dimensional image (Y scan image) 14 are obtained by one-dimensional scanning of the optical line 12 in X and Y directions, respectively (FIG. 2A). An abnormal contrast area 16 corresponding to a defect 8 appears on the first and second one-dimensional images 13, 14. A two-dimensional image 15 is obtained by applying an operation to the thus obtained two one-dimensional images. It is found that the abnormal contrast area 17 which appears on the two-dimensional image 15 corresponds to the defect 8 of the object to be tested 1.

Figure 3:
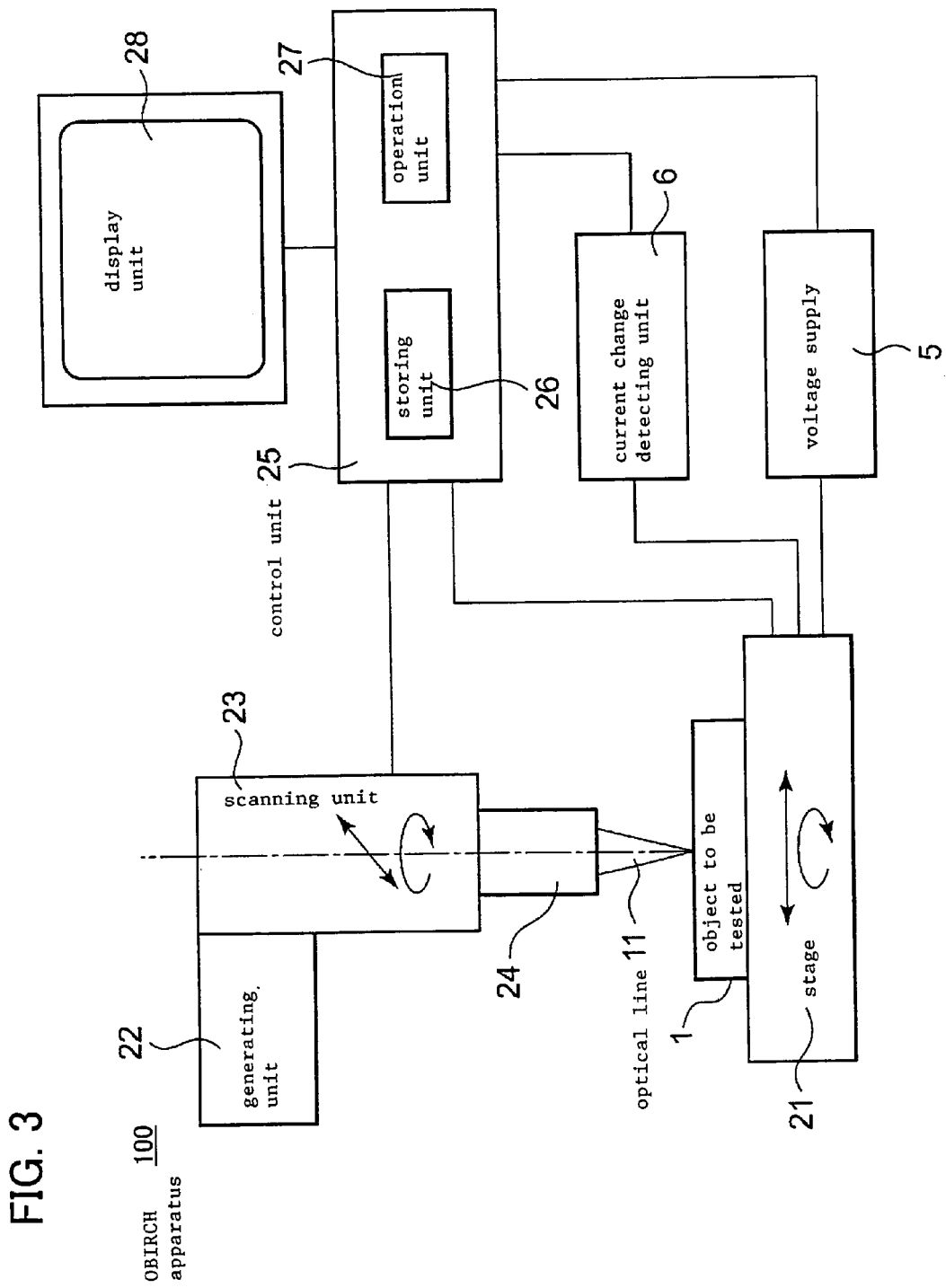
FIG. 3 is an apparatus arrangement view explaining an OBIRCH apparatus of an embodiment 1 to which the optical line scanning method of the present invention is applied.

FIG. 3 is an apparatus arrangement view explaining an OBIRCH apparatus 100 of the embodiment 1 to which the optical scanning method of the present invention is applied. The object to be tested 1 is placed on a stage 21. The voltage supply source 5 and current change detecting unit 6 are connected to two terminals of the object to be tested 1. The object to be tested 1 is placed so that the reverse side thereof faces the ultra-red laser light generating unit 22, laser light scanning unit 23 and laser light condensing (or focusing) unit 24 and the object to be tested 1 is irradiated with the laser light (optical line) 11. If the ultra-red light having a wave length of about 1 μm or more is used, the laser light is transmitted through a silicon substrate from the reverse side of an LSI chip so that it is condensed in the vicinity of the surface of the LSI chip. Therefore, it is possible to focusingly (selectively) heat the surface of the LSI chip and the vicinity thereof. The optical line 12 is relatively scanned over the object to be tested by scanning the rectilinear laser light 11 in an X direction (followed by scanning in Y direction) or by moving the stage 21 in an X direction (followed by moving in Y direction) at the laser light scanning unit 23 under control of the system control unit 25. Change in current at the area on the (main) surface side of the object to be tested, which is heated by the optical line 12 is detected by the current change detecting unit 6 and then stored in the storing unit 26 as first and second one-dimensional information. The operation unit 27 conducts operations to obtain two-dimensional information based upon the first and second one-dimensional information. The results of the operations may be stored in the storing unit 26. A display unit 28 displays the first and second one-dimensional images 13, 14 and two-dimensional image 15 based upon the first and second one-dimensional information and two-dimensional information. In order to easily identify the position(s) of the defect(s), a microscopic image on the (main) surface side of the object 1 to be tested and/or design layout may be displayed together with the foregoing images.

Figure 4:
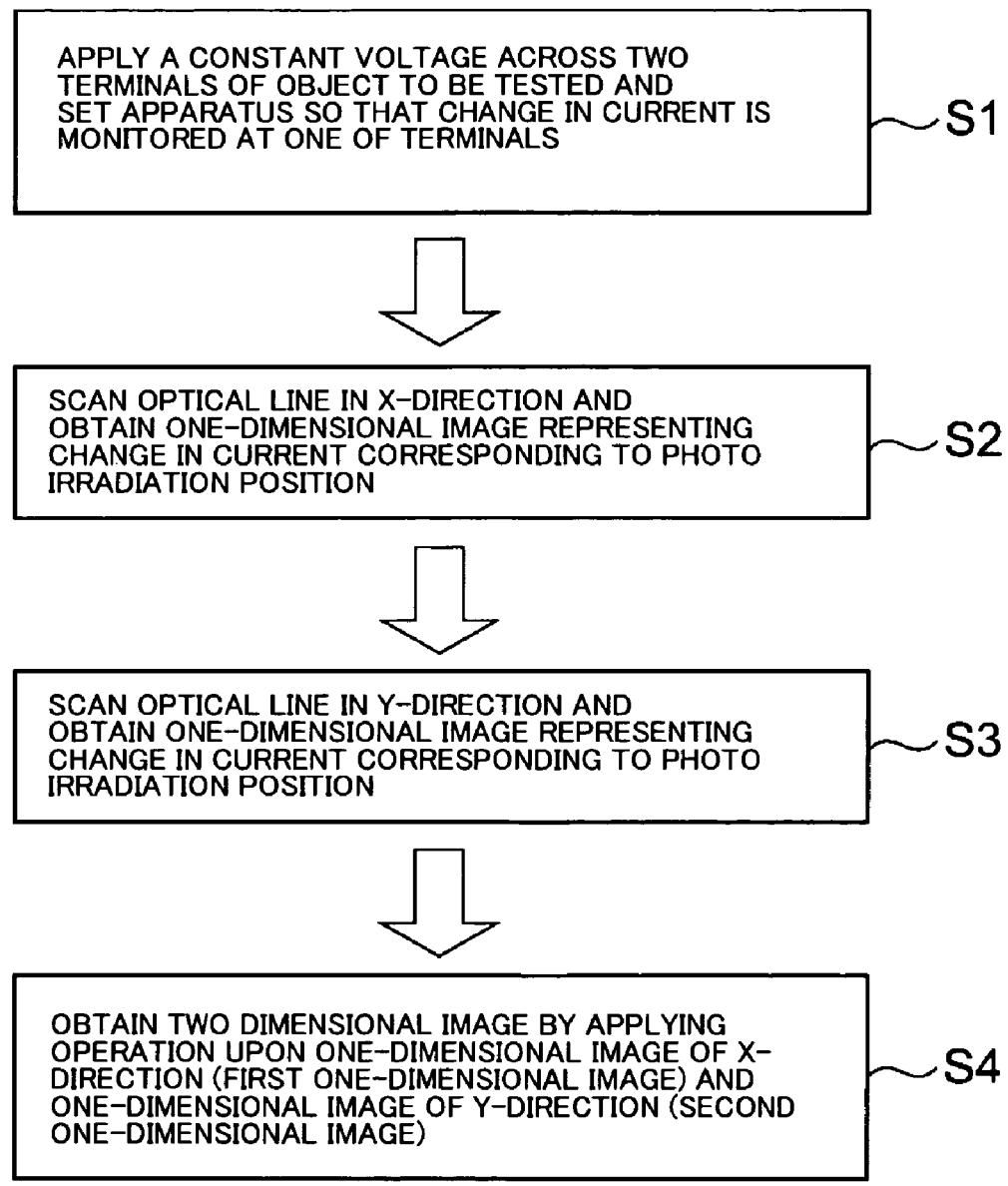
FIG. 4 is a flow chart explaining the steps of an OBIRCH method of an embodiment 1 to which the optical line scanning method of the present invention is applied.

FIG. 4 is a flow chart explaining the steps of the OBIRCH method of the embodiment 1 to which the optical line scanning method of the present invention is applied. A constant voltage is applied across two terminals of an electronic component which is the object 1 to be tested (for example, LSI chip) and the apparatus is set so that a change in current can be monitored at one of two terminals (step S1). Subsequently, the object 1 to be tested is irradiated on the reverse side thereof with ultra-red light or ultra-red laser light in the form of line (optical line), and the optical line 12 is scanned in an X-direction while the (main) surface side of the object 1 to be tested is heated with the optical line 12, so that the first one-dimensional image (X scan image) 13 in which the change in current corresponds to the light irradiated position is obtained (step S2). After the relative angle between the optical line 12 and the object 1 to be tested is rotated by 90°, a second one-dimensional image (Y scan image) 14 is obtained (step S3) by conducting the same operation as that at step S2. Then, a two-dimensional image is obtained by applying an operation upon the first and second one-dimensional images 13, 14 (step S4).

The period of time which is taken to obtain an image comprising 1000 by 1000 pixels (1,000,000 pixels) according to the method of the present invention is compared with the prior art. Assuming 1 m sec of dwell time per pixel, a period of time 1 m sec by 1000 by 1000=1000 secs (about 17 minutes) is taken in the prior art even if loss time is zero. In contrast, a period of time 1 m sec by 1000 by 2=2 seconds which is 1/500 of the prior art is taken in the method of the present invention, resulting in significant shortening of time. A period of time which is taken to complete an operation is sufficiently short even if an usual PC is used, so that it is negligible.

Although the principle of the optical line scanning method of the present invention is described by way of the OBIRCH method which is one of the conventional methods, the other methods are substantially identical with this optical line scanning method except for the phenomenon which is caused by a result of irradiation with light. For example, change in the resistance is caused by an irradiation with the light in the OBIRCH method. In the RIC or SDL method, the phenomena (changes) resulting from the laser irradiation provide basis for the determination by an LSI tester whether the object is qualified or not. A change in current is caused by irradiation with light in the OBIC or SCOBIC method. A change in magnetic field is caused by irradiation with light in the L-SQ method. A change in electromagnetic wave at Terahertz is caused by irradiation with light in the LTEM or non-bias LTEM method. Since how one-dimensional image is obtained, that is, a signal is detected as a result of irradiation with light corresponding to the position of line light scanning, can be fully understood with reference to the case of OBIRCH method, more detailed description thereof will be omitted.

Now, advantages of the embodiment 1 of the present invention will be described with reference to the drawings. Conditions under which the optical line scanning method of the present invention is effective will be described for helping systematic understanding of cases which will be described prior to the description of various cases.

A condition (1) on the side of the object 1 to be tested is that a contrast abnormality locally exists if an optical spot is scanned on a plane. In other words, if there is only one defect in an area to be observed, it is easier to specify the abnormal position than if there are a plurality of defects. A defect in a defective chip may be relevant to this case. In this case, an abnormal contrast area 17 on the two-dimensional image 15 which is obtained by applying an operation on the first and second one-dimensional images 13, 14 can be easily specified as a defective position as will be described hereafter. Since there is a case where a defective chip locally exists when viewing the whole of a wafer, it is relevant to this case. Also in this case, a defective chip can be specified from an abnormal contrast area on the two-dimensional image 15 which is obtained by applying an operation on the first and second one-dimensional images 13, 14.

A condition (2) of a detecting system is that the detection sensitivity of signal is the same even wherever is an abnormality at any location on the optical line 12. The signal detection sensitivity is influenced by the variation in sensitivity of the signal detecting system and the variation in strength of the optical line 12. In case of OBIRCH, OBIC, RIL and SDL, the sensitivity is the same even in the prior art signal detecting system. If there are variations in strength of the optical line, then the condition 2 would not be met. In case of L-SQ, LTEM and non-bias LTEM methods, non-uniform sensitivity distribution may exist in the detecting system other than variations in sensitivity distribution in the prior art signal detecting system. In this case, devising is necessary to meet the condition 2. Non-destructive testing such as localizing for identification (or target-throttling) of the defective position is possible since it is inherently qualitative even if the condition 2 is not met. However, the localizing of the defective position is slightly difficult. In case of L-SQ method and the like, the sensitivity suddenly decreases as the distance between the object to be tested and the detector increases. Therefore, if the condition 2 is not met, the test will become more difficult even qualitatively. Also in this case, countermeasure for testing is possible by arranging a plurality of SQUID elements 31 in an arrangement pitch of the LSI chip so that each of the SQUID elements 31 is disposed immediately above the center of the LSI chip as will be described below with reference to an embodiment 2 of FIGS. 9 and 10.

The optical line scanning method of the present invention can be easily and effectively applied if any one of the above-mentioned conditions 1 or 2 is satisfied as will be described below in detail in the subsequent case. The optical line scanning method can be effectively applied by devising as is shown in case 4 even if none of the conditions 1 and 2 is satisfied.

(Case 1)

Figure 5B:
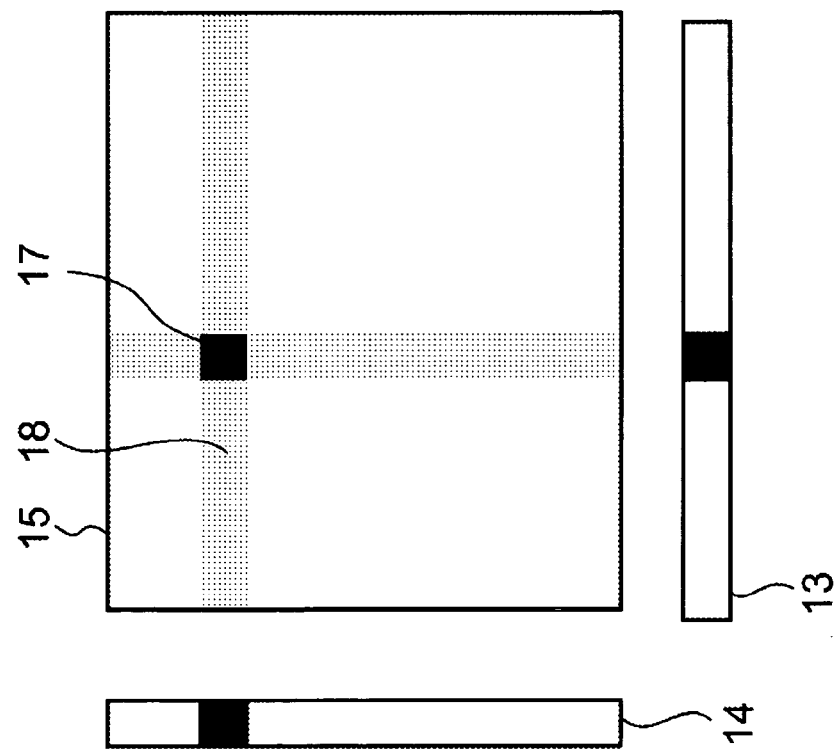
FIGS. 5A and 5B schematic views, respectively, explaining an example of observation result of an OBIRCH method of an embodiment 1 to which the optical line scanning method of the present invention is applied.
Figure 5A:
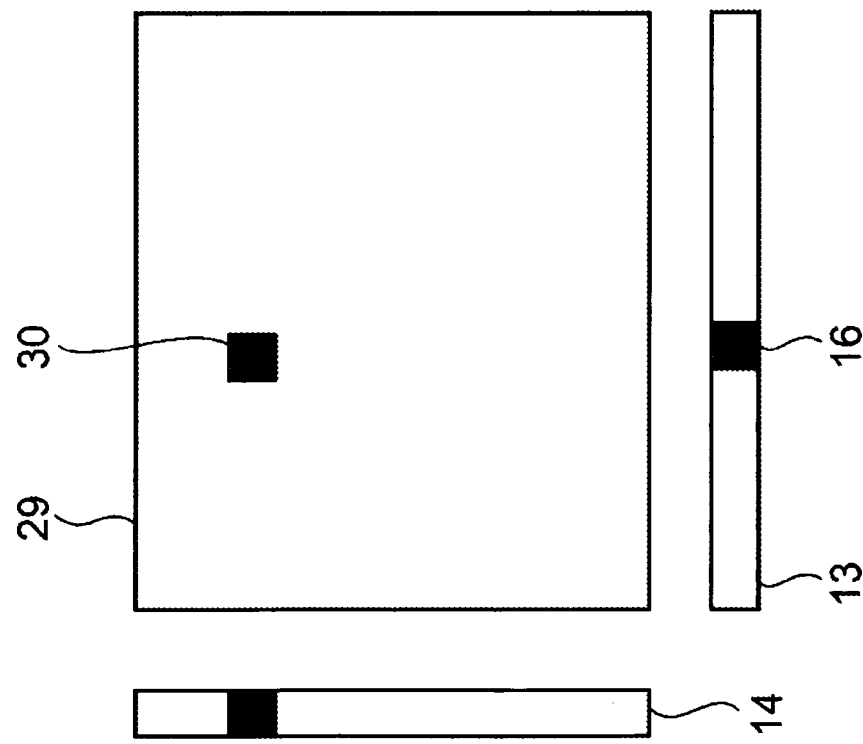

FIGS. 5A and 5B are schematic views, respectively, explaining a result of observation if both of the conditions 1 and 2 are satisfied. It is a case where there is one defective position and the signal detecting sensitivity is constant so that the application of the present invention is easiest. FIG. 5A is a view for comparison between a two-dimensional image 29 which is obtained from the object to be tested 1 by the prior art method and first and second one-dimensional images which are obtained by the inventive method. FIG. 5B is a view for comparison between first and second one-dimensional images 13, 14 which are obtained by the inventive method and two-dimensional image 15 which is obtained by the operation. One of the defective cases which most often occur in the most advanced LSI chips is a case where a high resistance position such as via holes in a wiring system on an LSI chip as an object to be tested, is detected by applying the present invention to OBIRCH, RIL or SDL method. This corresponds to this case 1.

Referring now to FIG. 5A, only one defect (one point) is represented by an abnormal contrast 30 on the prior art two-dimensional image 29, and by an abnormal contrast 16 on the first one-dimensional image (X scan image) 13 and second one-dimensional image (Y scan image) 14. For clarity, inherent abnormal contrast corresponding to the defect position is represented by a solid square (this will be applied to the embodiments which will be described below).

Referring now to FIG. 5B, the first and second one-dimensional images 13, 14 are similar to those in FIG. 5A. The abnormal contrast area 17 on the two-dimensional image 15 which is obtained by applying an operation on the one-dimensional images 13, 14 extends in X- and Y-directions as pale strips. If it is understood that the two-dimensional image having elements a(x, y) is obtained by conducting a sum operation such as a(1,1)=x1+y1; a(1,2)=x1+y2; ... a(1000, 1000)=x1000+y1000 for the matrix elements obtained from the one-dimensional image in an X-direction (x1, x2, ..., x1000) and the one-dimensional image in an Y-direction (y1, y2, ..., y1000), the highest contrast area which is an intersection between the strips (artifacts 18) extending in X- and Y-directions can be easily understood as inherent abnormal contrast area. If reconstruction of the two-dimensional image 15 is carried out by a product operation, not sum operation, such pale strips would not appear.

If there is a high resistance defect at the bottom of a via hole of a wiring system on an LSI, a current flowing through usual wiring is represented as dark contrast area (corresponding to an increase in resistance) while only an area on which there is an abnormal via hole is locally represented as bright contrast area (corresponding to a decrease in resistance) when the OBIRCH method is used. Copper and aluminum which is used for wiring have its resistance having a positive coefficient for temperature (its resistance increases with the elevation of temperature). In contrast to this, a high resistance defect portion is made of a high resistance alloy of transient metal such as titanium, which has a negative temperature coefficient of resistance (its resistance decreases with the temperature elevation). Therefore, such a phenomenon occurs. The condition 1 is satisfied if there is one abnormal via hole in an area to be observed.

(Case 2)

Figure 6B:
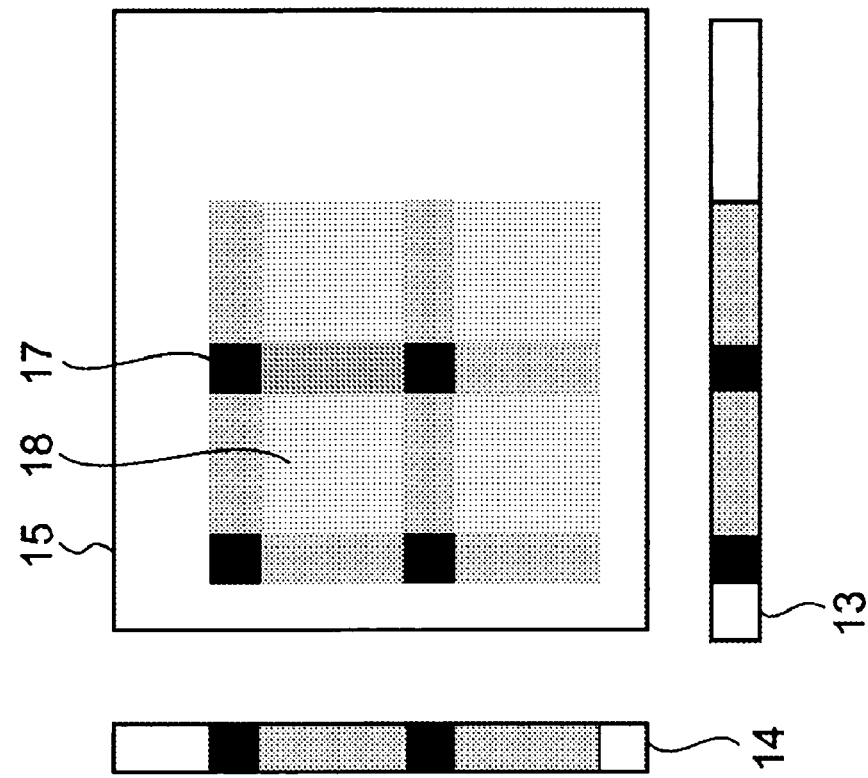
FIGS. 6A and 6B are schematic views, respectively, explaining another example of observation result of an OBIRCH method of an embodiment 1 to which the optical line scanning method of the present invention is applied.
Figure 6A:
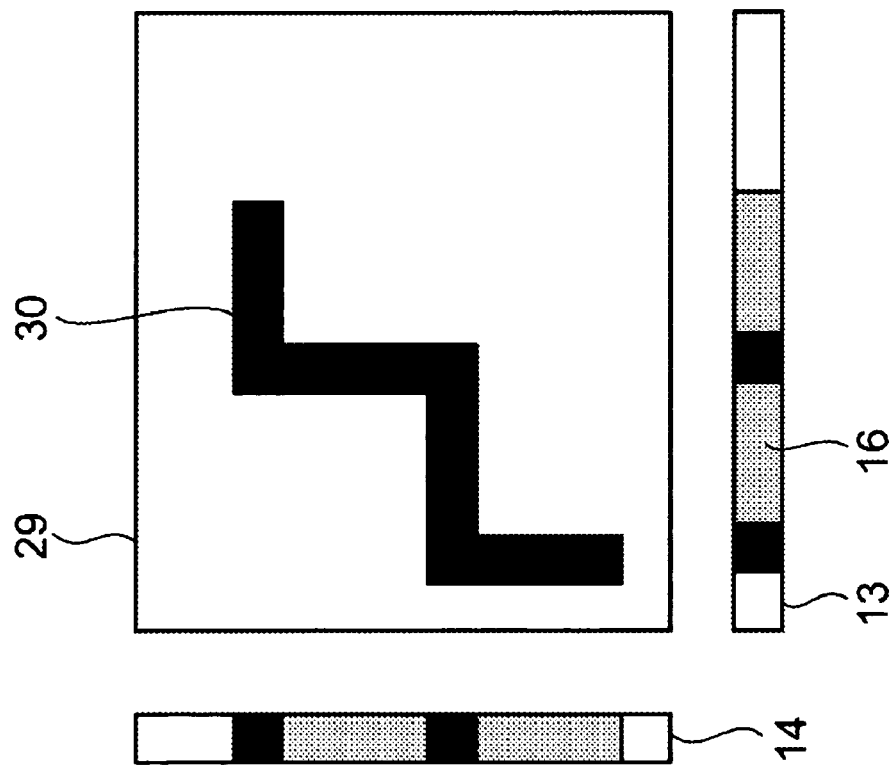

FIGS. 6A and 6B are views explaining an observation result when the condition 2 is satisfied and the condition 1 is not satisfied. FIG. 6A is a view for comparison between a two-dimensional image 29 which is obtained from an object 1 to be tested by a prior art method and first and second one-dimensional images 13, 14 which are obtained by the method of the present invention. FIG. 6B is a view for comparison between first and second one-dimensional images 13, 14 which are obtained by the method of the present invention and the two-dimensional image 15 which is obtained by an operation. One of the defective cases which most often occur in the most advanced LSI chips in which an abnormal path of wiring current is detected is relevant to this case 2. Although devising is necessary to specify the defective location since the condition 1 is not satisfied, the total analyzing period of time can be shortened.

Referring now to FIG. 6A, an abnormal contrast area 30 on the prior art two-dimensional image 29 and abnormal contrast areas 16 on the first and second one-dimensional image 13, 14 are more complicated than those in FIG. 5A. The abnormal contrast area 30 on the prior art two-dimensional image 29 is in the form of wiring. The abnormal contrast area 16 having dense (dark) portions and pale portions is obtained on the first and second one-dimensional images 13, 14, respectively.

Referring to FIG. 6B, the first and second one-dimensional images 13, 14 are identical with those in FIG. 6A. The abnormal contrast area 17 on the two-dimensional image 15 which is obtained by conducting an operation for the first and second one-dimensional images 13, 14 extends over the image. Although the two-dimensional image 15 includes information of the prior art two-dimensional image 29 of FIG. 6A, it also includes other many contrast area (such as artifact 18). With such an acceptable number of artifacts, it is possible to reconstruct the inherent abnormal contrast area(s) at a higher probability by comparing the artifacts with design layout information of LSI representing the positions of existing wiring. Since target-narrowing of defective location using the design layout information is becoming essential for defect or failure analysis of current modern LSIs, no special working is necessary. If there is no design layout information, it suffices to obtain a two-dimensional image by a conventional two-dimensional scanning method after the detected defect location is narrowed by the optical scanning method of the present invention. In this case, rough narrowing in which magnification is gradually (or stepwise) increased from a low magnification is conducted by the optical line scanning method of the present invention. Subsequently, final narrowing at a high magnification is conducted by the conventional two-dimensional scanning method. This significantly shortens the total narrowing period of time.

(Case 3)

Figure 7B:
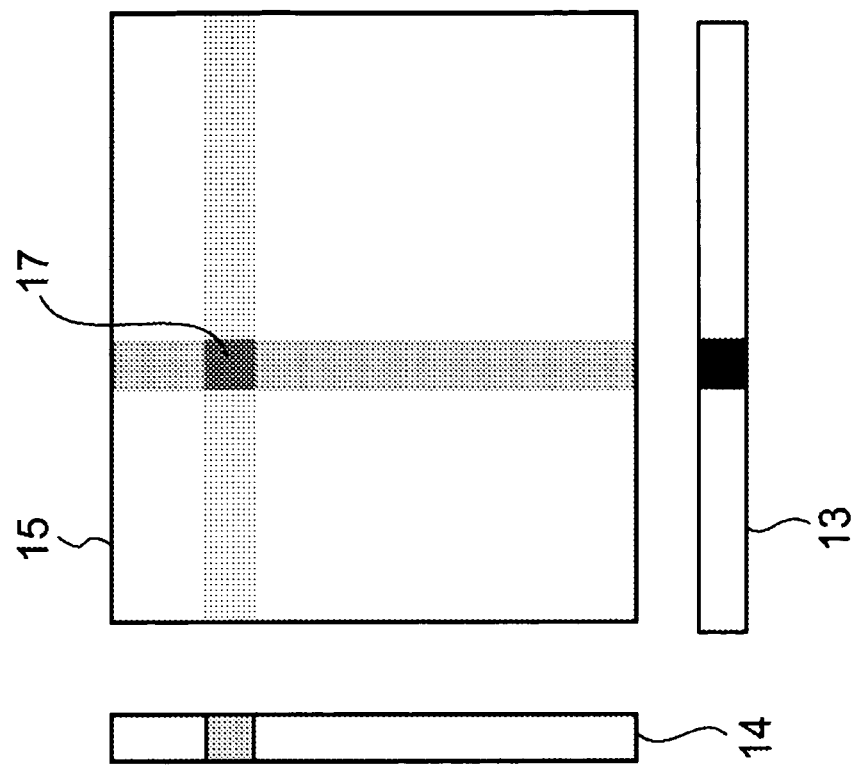
FIGS. 7A and 7B are schematic views, respectively, explaining a third example of observation result of an OBIRCH method of an embodiment 1 to which the optical line scanning method of the present invention is applied.
Figure 7A:
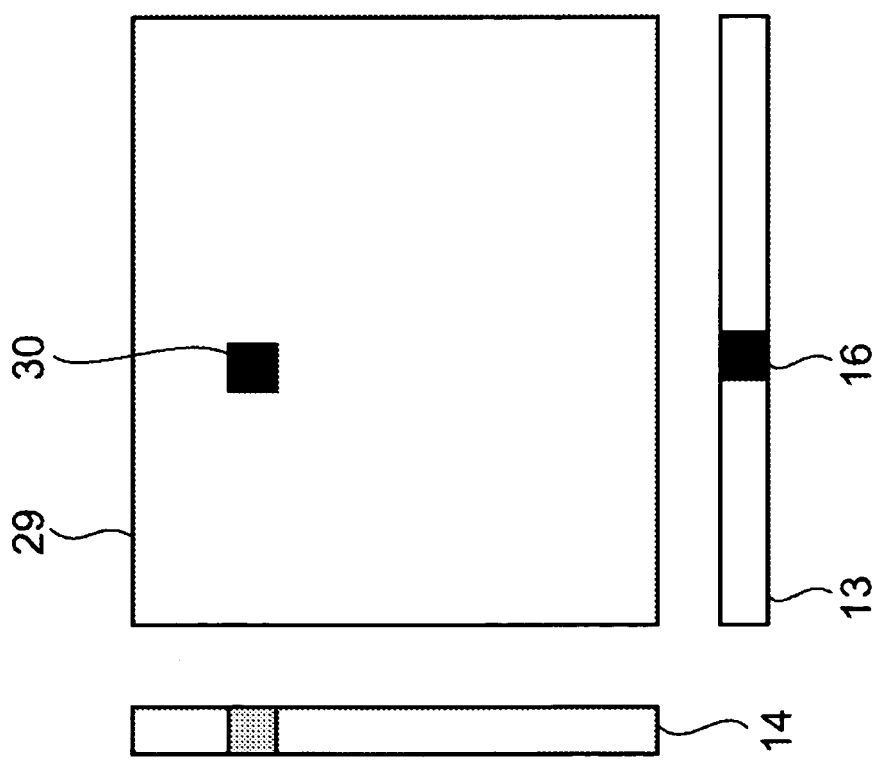

FIGS. 7A and 7B are schematic views, respectively, explaining an observation result when the condition 1 is satisfied while the condition 2 is not satisfied. The case 3 is a case where there is only one defect location and the signal detection sensitivity is non-uniform so that application of the present invention is relatively easy. FIG. 7A is a view for comparison between a two-dimensional image 29 which is obtained from the object to be tested 1 by the prior art method and the first and second one-dimensional images 13, 14 which are obtained by the method of the present invention. FIG. 7B is a view of comparison between the first and second one-dimensional views 13, 14 which are obtained by the method of the present invention and the two-dimensional view 15 which is obtained by conducting an operation. In this case, it is assumed that the sensitivity of the detector is higher in the center of the observation area and becomes lower towards the periphery. This is relevant to L-SQ method in which the center of a SQUID element of one kind is aligned with the center of the object to be tested. A case where the optical line strength is non-uniform so that the strength of the optical line is stronger in the center of the observation area and becomes weaker towards the periphery is relevant to this case.

Referring now to FIG. 7A, an abnormal contrast area 30 on the prior art two-dimensional image 29 and an abnormal contrast area 16 on the first and second one-dimension images 13, 14 of the present invention are not qualitatively different from those in FIG. 5A. However, it is found that due to low sensitivity at periphery, the contrast of the abnormal contrast area on the second one-dimensional image (Y scan image) 14 is lower than that of the abnormal contrast area 16 on the first one-dimensional image (X scan image) 13.

Referring now to FIG. 7B, the first and second one-dimensional images 13, 14 are similar to those in FIG. 7A. There are abnormal contrast area 17 (which is obtained by conducting a sum operation for the one-dimensional images) and pale strips extending in X- and Y-directions. These are qualitatively similar to those in FIG. 5B. Quantatively, there is a difference (in the brightness) between the strips extending from the abnormal contrast area 7 depending upon the difference between contrast grades of the first and second one-dimensional images 13, and 14. This difference will not hinder the identification of an intersection which is an inherent abnormal contrast 17. In such a manner, it is found that the optical line scanning method is also effective in the case of FIGS. 7A and 7B. If the operation for reconstructing the two-dimensional image 15 is a product operation, not sum operation as is in this case, extending pale strips would not appear.

(Case 4)

Figure 8B:
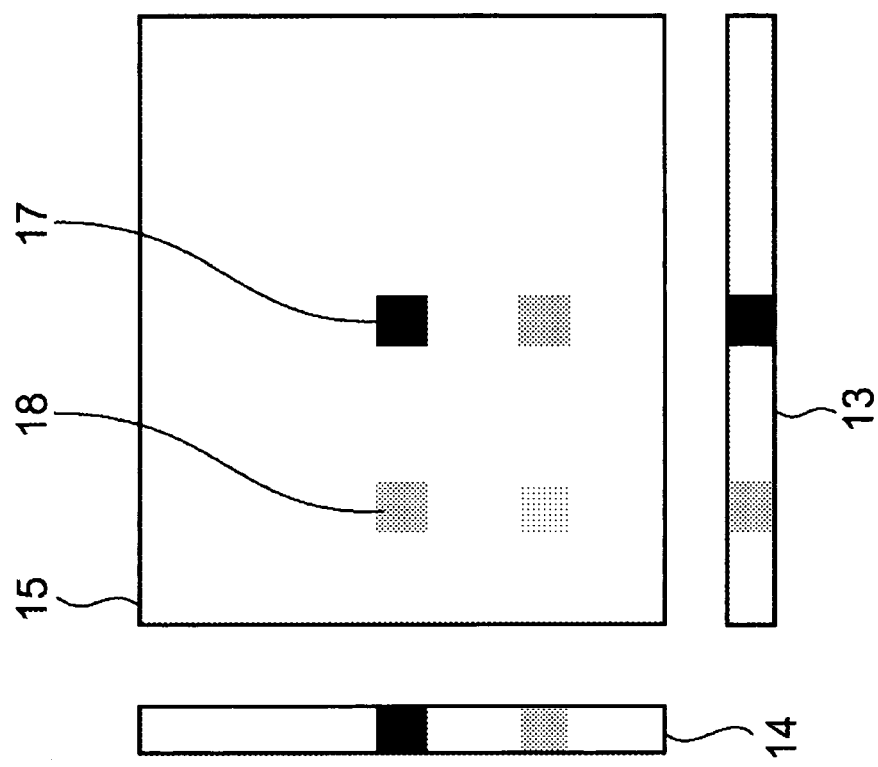
FIGS. 8A and 8B are schematic views, respectively, explaining a fourth example of, observation result of an OBIRCH method of an embodiment 1 to which the optical line scanning method of the present invention is applied.
Figure 8A:
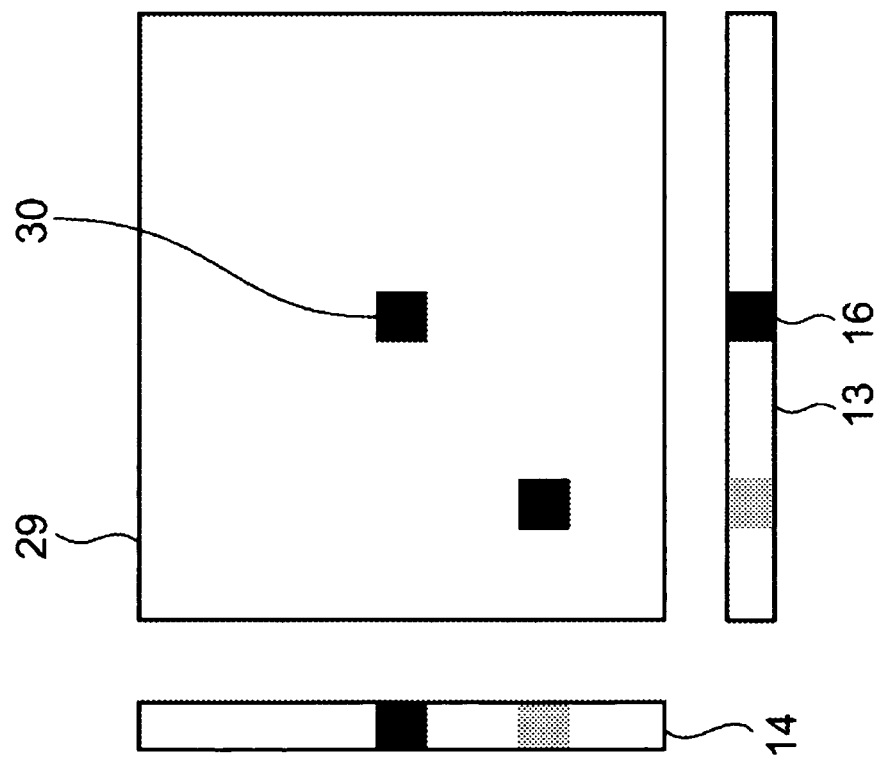

FIGS. 8A and 8B are schematic views, respectively, explaining an observation result when none of the conditions 1 and 2 are satisfied. FIG. 8A is a view for comparison between a two-dimensional image 29 which is obtained from the object to be tested 1 by the prior art method and first and second one-dimensional images 13, 14 which are obtained by the method of the present invention. FIG. 8B is a view for comparison between the first and second one-dimensional images 13, 14 which are obtained by the method of the present invention and the two-dimensional image 15 which is obtained by an operation. Since the operation for the reconstruction of the two-dimensional images 15 is a product operation, not the sum operation like the foregoing three cases, there is no strips extending from the abnormal contrast area 17 on the two-dimensional image in FIG. 8B. In this case, none of the conditions 1 and 2 is satisfied, so that application of the present invention is relatively difficult. In FIGS. 8A and 8B, it is assumed that the sensitivity of the detector is higher in the center of the observation area and becomes lower toward the periphery. This corresponds to a case in which the center of a kind of SQUID element is aligned with the center of the object 1 to be tested in L-SQ method. A case where the optical line strength is non-uniform so that the strength of the optical line is higher in the center of the observation area and becomes lower toward the periphery is relevant to Case 4.

Referring to FIG. 8A, an abnormal contrast areas 30 are found at two locations on the prior art two-dimensional image 29. At a location where such an abnormal contrast is found by L-SQ method, a closed loop is formed by a short-circuited wiring extending from each of p- and n-sides of a p-n junction. The location of the abnormal contrast area 30 corresponds to the p-n junction. It is found that the abnormal contrast area 16 on the first and second one-dimensional images 13, 14 of the present invention is not qualitatively different from the abnormal contrast area 30 which is obtained by the prior art method, but there are strong (high grade) and week (low grade) contrast areas due to low sensitivity at the periphery of the image.

Referring now to FIG. 8B, on the reconstructed two-dimensional image 15, there are two extra abnormal contrast areas (artifacts 18) which are not found on the inherent two-dimensional image 29. The abnormal contrast area (left and lower most pale spot) which is detected at low sensitivity area has a tendency that its density is lower than that of an artifact 18. Comparison between the abnormal contrast area and the design layout information is often effective to determine which of four contrast areas is inherent abnormal contrast area or artifact. The artifacts can be eliminated at a high probability by determining whether or not the p-n junction exists at four positions on the design layout. If the artifacts can not be eliminated or comparison with the design layout information can not be made, it suffices to obtain the two-dimensional image by the prior art two-dimensional scanning method after the location of the abnormal contrast area is narrowed by the optical line scanning method of the present invention. In this case, rough narrowing in which the magnification is gradually increased from a low magnification is conducted by the photo line scanning method and final narrowing at high magnification is conducted by the prior art two-dimensional scanning method. This process remarkably shortens the total time taken to conduct narrowing.

Embodiment 2

Figure 9:
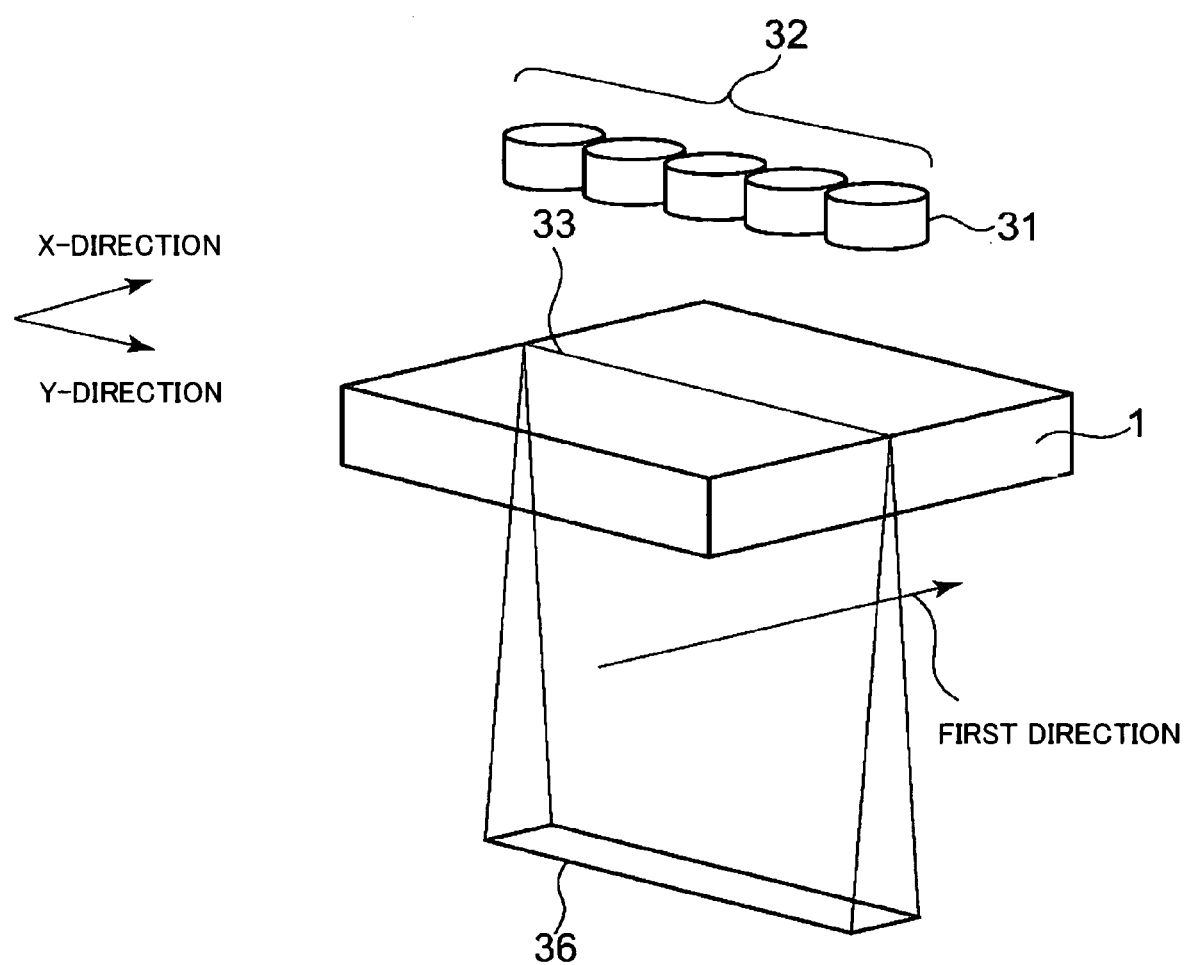
FIG. 9A is a basic principle view explaining an embodiment 2 in which the optical line scanning method of the present invention is applied.

FIG. 9 is a basic principle view explaining an embodiment 2 to which the optical line scanning method of the present invention is applied. An object to be tested 1 is irradiated from its reverse side with laser light 36 which is in the form of line. The optical line 33 is relatively scanned over the object to be tested 1 in first and second directions (X and Y directions) similarly to embodiment 1. A SQUID element array 32 which is a magnetic field detector does not use only one SQUID element, but uses SQUID elements which are disposed in an array. The optical line 33 and the SQUID element array 32 are disposed so that the optical line is vertically super-imposed upon the SQUID element array along the longitudinal direction of the optical line. Since misalignment of the optical line 33 with the SQUID element array 32 decreases the sensitivity in L-SQ method, it is preferable to fix the optical line and the SQUID element array 32 and to relatively scan the optical line 33 by moving the object 1 to be tested.

Figure 10:
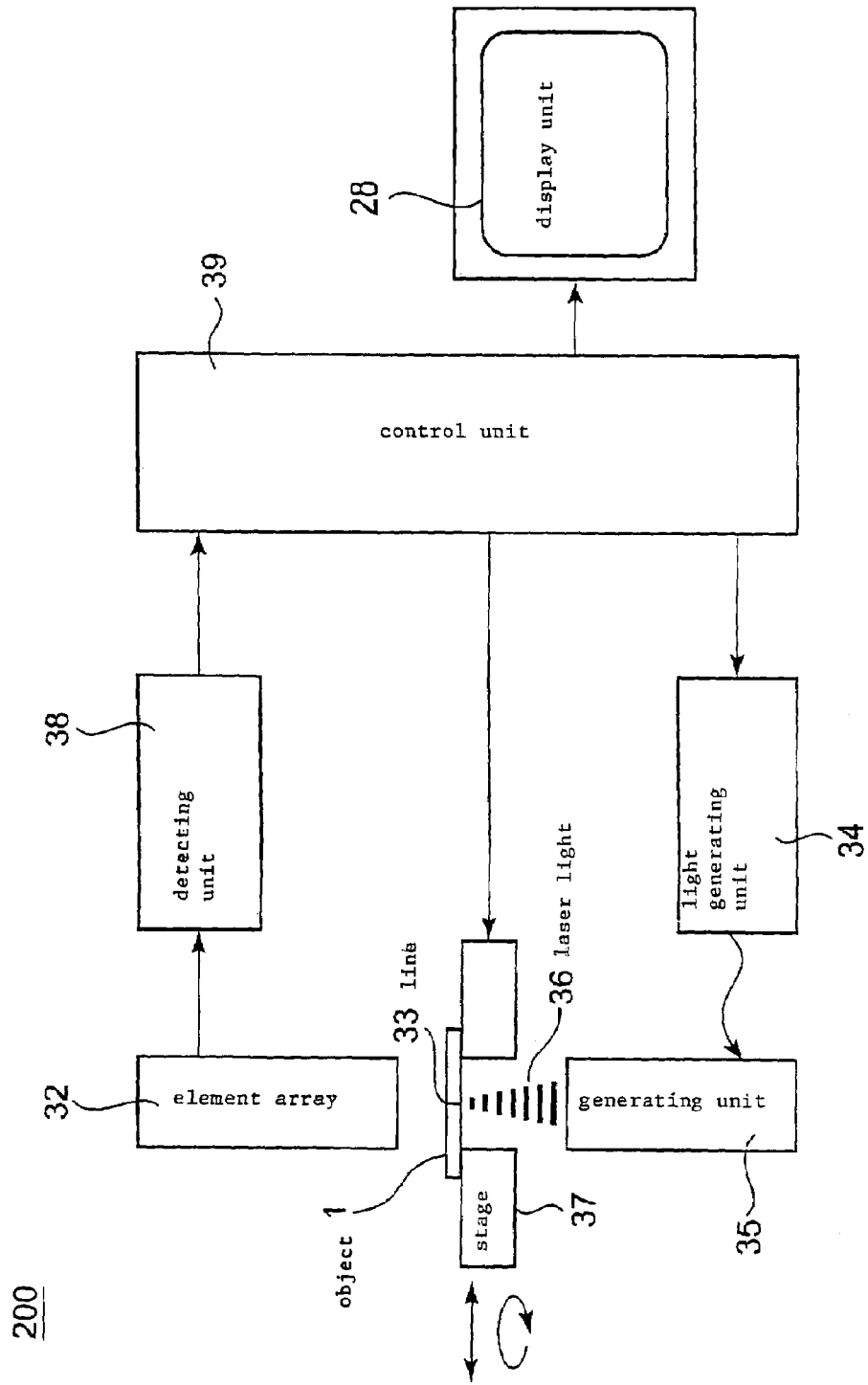
FIG. 10 is an apparatus arrangement view explaining an L-SQ apparatus of an embodiment 2 to which the optical line scanning method of the present invention is applied.

FIG. 10 is an apparatus arrangement view explaining an L-SQ apparatus 200 of the embodiment 2 to which the optical line scanning method of the present invention is applied. Laser light which is generated by a laser light generating unit 34 is modulated and shaped by a modulated beam generating unit 35, the object 1 to be tested is irradiated its reverse side with laser light 36 in the form of line. A stage 37 comprises a mechanism to enable the stage 37 to move in a horizontal direction and rotate so that the optical line 33 is relatively scanned over the object to be tested 1 in first and second directions (X- and Y-directions) under control of a system control unit 39. The SQUID element array 32 is disposed above the object to be tested 1 to detect the magnetic field formed by the object 1 to be tested. The detected magnetic field is extracted at a magnetic field signal detecting unit 38 as first and second one-dimensional information and then fed to the system control unit 39. Operation and display of the two-dimensional image is similar to that in embodiment 1.

Figure 11A:
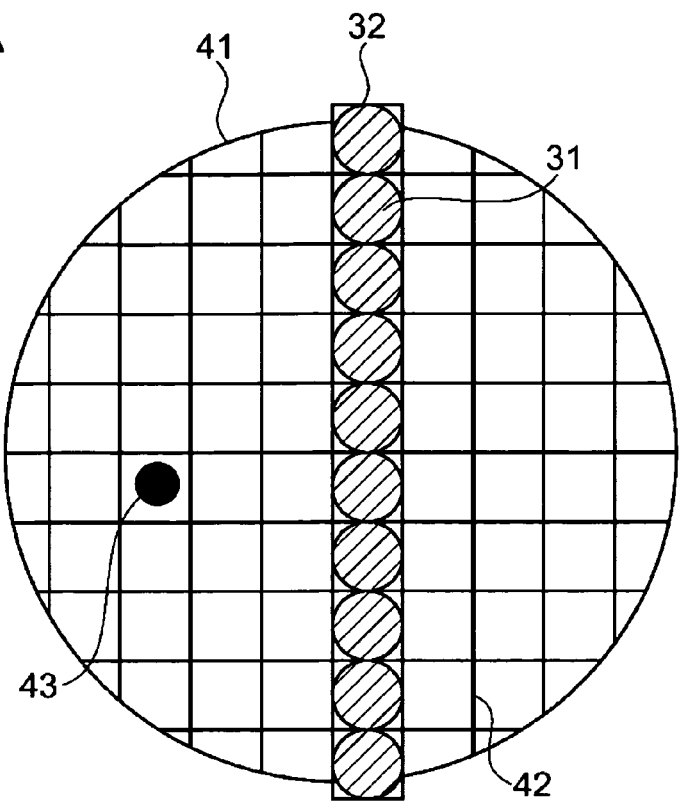
FIGS. 11A, 11B and 11C are schematic views, respectively, explaining an example of observation result which is obtained by L-SQ method of an embodiment 2 to which the optical line scanning method of the present invention is applied.
Figure 11B:
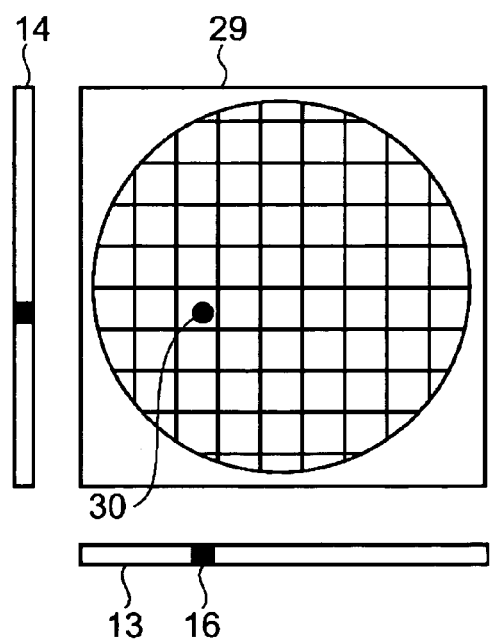
Figure 11C:
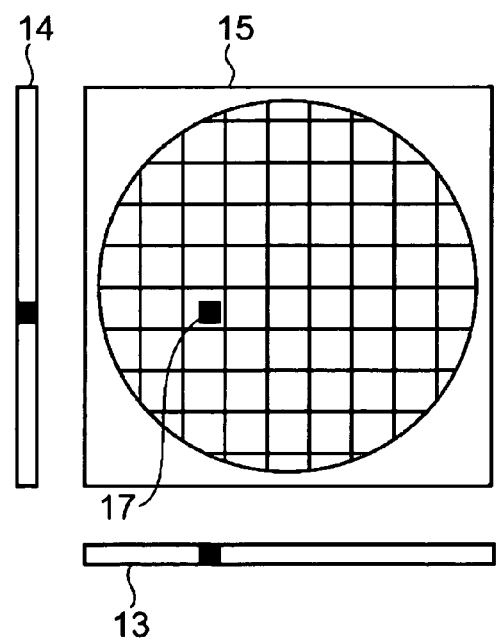
Figure 13:
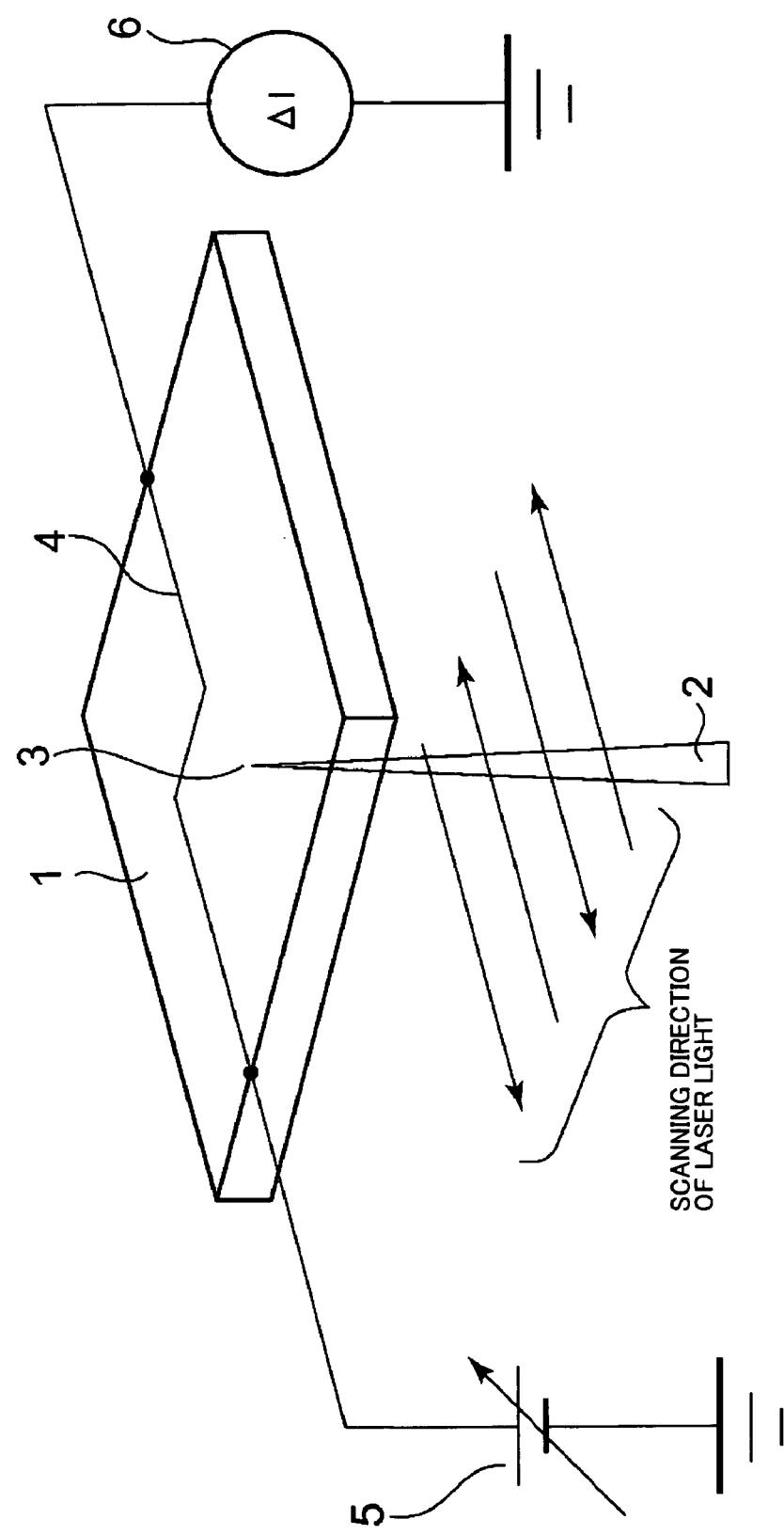
FIG. 13 is a basic principle view explaining OBIRCH method using related art two-dimensional scanning.
Figure 14:
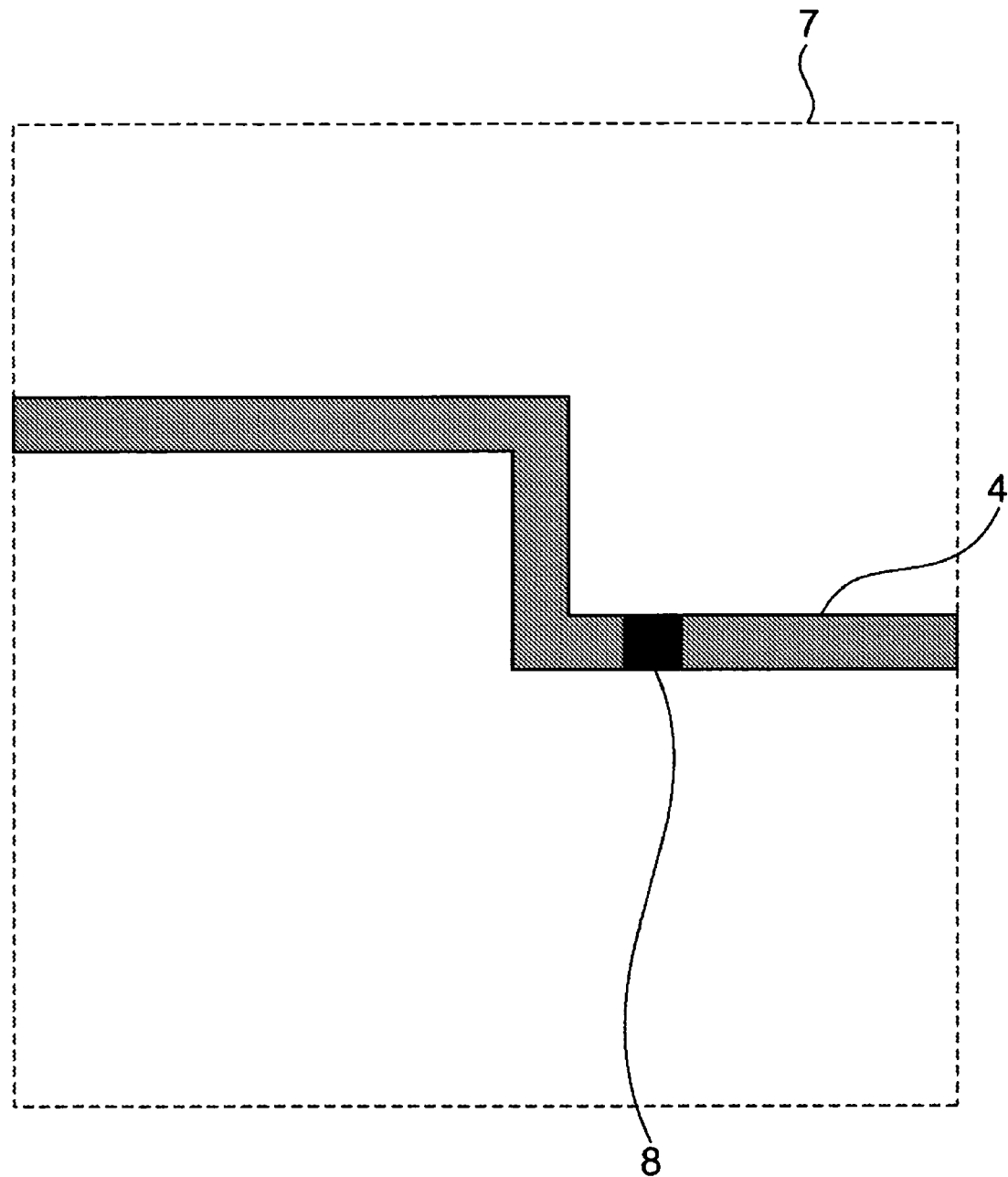
FIG. 14 is a schematic view explaining an observation result of the object to be tested which is obtained by using OBIRCH method using the related art two-dimensional scanning method.

FIGS. 11A, 11B and 11C are schematic views, respectively, explaining a defective LSI chip discriminating method which is an observation result of the L-SQ method of the embodiment 2 to which the optical line scanning method of the present invention is applied. FIG. 11A is a view in which a semiconductor wafer 41 which is an object to be tested is projected from an upper position. FIG. 11B is a view for comparison between two-dimensional view 29 which is obtained by the prior art method and first and second one-dimensional images 13, 14 which are obtained by the method of the present invention. FIG. 11C is a view for comparison between the first and second one-dimensional images which are obtained by the present invention and the two-dimensional image 15 which is obtained by an operation. In the two-dimensional image, the contour of the semiconductor wafer 41 is superimposed upon a scribe line 42. In this case, the location of a defect in an LSI chip is not target-narrowed, but a defective LSI chip 43 is discriminated from the entire semiconductor wafer 41. A phenomenon which is caused by the laser light irradiation will be described with reference to L-SQ phenomenon. In this example, LSI chips each having, for example, 30 mm square are formed on a semiconductor wafer 41 of 300 mm φ which is an object to be tested. The SQUID element array 32 comprises 10 SQUID elements 31 which are arrayed at a pitch of 30 mm which is same as that of LSI chips. The number and array pitch of the SQUID elements 31 may be changed depending upon the size of the LSI chips. The variations in sensitivity to discriminate a defective LSI chip 43 among LSI chips on the wafer 41 can be eliminated by matching the arraying pitch of the SQUID elements 31 with the LSI chip size. The optical line 33 has a length of 300 mm to cover the entire of the semiconductor wafer 41 and is scanned at a distance of 300 mm. Scanning is most efficiently conducted by moving the semiconductor wafer 41 while the optical line 33 and SQUID element array 32 are disposed fixedly. After scanning in an X-direction, it suffices to rotate the semiconductor wafer 41 by 90° for scanning in a Y-direction.

In this embodiment, operation for the reconstruction of the two-dimensional image 15 is a product operation, not sum operation. For brevity the embodiment is shown in which only one defective LSI chip exists on the semiconductor chip and only one defective location exists in the defective LSI chip.

Referring to FIG. 11B, there is shown an abnormal contrast area 30 at one location in the prior art two-dimensional image 29. An LSI chip having such an abnormal contrast area can be identified as a defective LSI chip 43. At a location where such a contrast area is found in L-SQ method, a closed loop is formed by short circuited wirings each extending each of p and n sides of a p-n junction. Even also in one-dimensional image, each of X- and Y-scanning images 13, 14 has only one abnormal contrast area 16.

Referring now to FIGS. 11A, 11B and 11C, an abnormal contrast area 17 is clearly reproduced in the two-dimensional image 15 which is reconstructed from the first and second one-dimensional images 13, 14, so that a defective LSI chip 43 can be clearly identified. For clarity, the abnormal contrast area 17 is represented as solid square in FIG. 11C In the present embodiment, how much the period of time which is taken to discriminate LSI chips is shortened in comparison with that taken in the prior art method is estimated. The S/N ratio (signal to noise ratio) is increased by modulating the strength of the laser light to extract only signal having a modulation frequency in a lock-in amplifier in the L-SQ method. A time constant which is about 10 times of a period corresponding to the modulation frequency of the optical light is set in the lock-in amplifier. The scanning speed of the optical line is preset to about such a value that the optical line passes one pixel element in the image during the passage of the same time as the time constant. If modulation is conducted at 1 MHz, the time constant becomes 10 μsecs. If a pixel is 0.5 μm square, 300 mm would be displayed with 600000 pixels on the one-dimensional image. The period of time taken to scan in one direction is 10 μs×600000=6 seconds. Since the conveying speed of a stage on which a semiconductor wafer is mounted is limited to 100 mm/sec in a non-destructive testing apparatus under the L-SQ method which is currently under development, a period of 3 seconds is sufficient to scan across 300 mm. Acquisition of an image in accordance with the present invention is completed by moving a semiconductor wafer 41 in an X-direction in 6 seconds and thereafter rotating the stage by 90° and then moving the semiconductor wafer 41 in a Y-direction in 6 seconds. Even if a period of time taken to rotate the stage 37 is estimated as one second as a little longer time and a period of time to reproduce the three-dimensional image 15 is estimated as one second as a little longer time it takes only 14 seconds in total. On the other hand, a period of time taken to conduct two-dimensional scanning in the prior art method is 10 μsec×600000×600000=3600000 secs=1000 hours which is non-feasible time even if loss time of scanning is neglected. In other words, discrimination of defective LSI chip by the L-SQ method is almost impossible unless the method of the present invention is used.

Embodiment 3

FIG. 12 is a basic principle view explaining an embodiment 3 in which the optical line scanning method of the present invention is applied to the non-bias LTEM method. An object to be tested 1 is irradiated on its reverse side with femto second laser light 51 which is in the form of line and the optical line 52 is scanned over the object to be tested in first and second directions (X- and Y-direction). Terahertz (THz) electromagnetic wave 53 which is generated by the object to be tested 1 is detected by THz electromagnetic wave detectors 54. A method of reconstructing a two-dimensional image from first and second one-dimensional images is identical with that in the foregoing embodiments. Also in non-bias LTEM method, a plurality of THz electromagnetic wave detectors 54 are disposed similarly to L-SQ method. Moving the object to be tested while fixing the optical line and detectors provides higher detection sensitivity and efficiency.

Although the present invention has been described with reference to the drawings, the present invention is not limited to the arrangement of the foregoing embodiments. It is to be understood that various modifications and alternations can be made by those skilled in the art without departure from the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A non-destructive testing method comprising:
   irradiating an object to be tested with a line-formed light forming a rectilinear optical line, said rectilinear optical line having a length sufficient to cover at least a portion of the object;
   relatively scanning said rectilinear optical line over said object to be tested in a first direction intersecting said optical line to obtain a first one-dimensional image;
   and relatively scanning said rectilinear optical line over said object to be tested in a second direction intersecting said first direction to obtain a second one-dimensional image,
   wherein said first and second one-dimensional images are obtained by a scanning laser Superconducting Quantum Interference Devices (SQUID) method in which a plurality of SQUID elements are arrayed in a line, provided that said rectilinear optical line and said plurality of SQUID elements arrayed in the line are fixed so that they vertically overlap each other along a longitudinal direction of said rectilinear optical line.

2. A non-destructive testing method as defined in claim 1 wherein said first direction is perpendicular to a longitudinal direction of said rectilinear optical line.

3. A non-destructive method as defined in claim 1 wherein a two-dimensional image is obtained from said first and second one-dimensional images through an operation.

4. A non-destructive method as defined in claim 3 wherein an abnormal location of said object to be tested is localized for identification from said two-dimensional image.

5. A non-destructive method as defined in claim 1 wherein said rectilinear optical line has a length sufficient to cover an entire length or width of the object.

6. A non-destructive method as defined in claim 1 wherein a two-dimensional image is obtained by a sum operation of said first and second one-dimensional images.

7. A non-destructive testing apparatus comprising:
   a light source irradiating an object to be tested with a line-formed light forming a rectilinear optical line, said rectilinear optical line having a length sufficient to cover at least a portion of the object;
   a moving unit that relatively moves said rectilinear optical line over said object to be tested;
   a one-dimensional image forming unit that forms a one-dimensional image from an observation result of a phenomenon which is caused by irradiation of said object to be tested with said optical line; and a two-dimensional image forming unit that forms a two-dimensional information or image from a plurality of said one-dimensional images, wherein an observation system is configured to observe a phenomenon caused by irradiation with said rectilinear optical line by a scanning laser Superconducting Quantum Interference Devices (SQUID) method in which a plurality of SQUID elements are arrayed in a line, provided that said rectilinear optical line and said plurality of SQUID elements arrayed in the line are fixed so that they vertically overlap each other along a longitudinal direction of said rectilinear optical line.

8. A non-destructive testing apparatus as defined in claim 7 wherein said moving unit comprises an optical line scanning unit that moves said rectilinear optical line.

9. A non-destructive testing apparatus as defined in claim 7 wherein said moving unit comprises a stage that moves said object to be tested.

10. A non-destructive testing apparatus as defined in claim 9 wherein positions of said rectilinear optical line and a detector of said observation system are fixed and; at least one of L-SQ, LTEM and non-bias LTEM is used.

11. A non-destructive testing apparatus as defined in claim 7 wherein said rectilinear optical line has a length sufficient to cover an entire length or width of the object.

12. A non-destructive testing apparatus as defined in claim 7 wherein said two-dimensional image forming unit comprises a display unit for displaying said formed two-dimensional image and a plurality of said one-dimensional images from which said two-dimensional image is obtained.

13. A non-destructive testing apparatus as defined in claim 12 wherein said display unit displays a layout of said object to be tested and said two-dimensional image so that the former image is superimposed on the latter image.

14. A non-destructive testing apparatus as defined in claim 7 wherein the apparatus is configured to produce a two-dimensional image by a sum operation of said first and second one-dimensional images.

* * * * *